(12) United States Patent
Brauer (10) Patent No.: US 10,698,325 B2
(45) Date of Patent: Jun. 30, 2020

(54) PERFORMANCE MONITORING OF DESIGN-BASED ALIGNMENT

(71) Applicant: KLA-TENCOR CORPORATION, Milpitas, CA (US)

(72) Inventor: Bjorn Brauer, Beaverton, OR (US)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 16/400,756

(22) Filed: May 1, 2019

(65) Prior Publication Data

US 2019/0361363 A1 Nov. 28, 2019

Related U.S. Application Data

(60) Provisional application No. 62/675,641, filed on May 23, 2018.

(51) Int. Cl.
| | | |
|---|---|---|
| *G06F 9/00* | (2006.01) | |
| *G03F 9/00* | (2006.01) | |
| *G01N 21/93* | (2006.01) | |
| *G01N 21/956* | (2006.01) | |
| *G03F 7/20* | (2006.01) | |
| *G01N 21/95* | (2006.01) | |
| *H01L 21/66* | (2006.01) | |

(52) U.S. Cl.
CPC .......... *G03F 9/7007* (2013.01); *G01N 21/93* (2013.01); *G01N 21/9501* (2013.01); *G01N 21/95607* (2013.01); *G03F 7/7065* (2013.01); *G03F 9/7019* (2013.01); *H01L 22/12* (2013.01)

(58) Field of Classification Search
CPC .............. G01N 21/93; G01N 21/9501; G01N 21/95607; G03F 7/70616; G03F 7/70633; G03F 7/7065; G03F 9/7007; G03F 9/7019; G03F 9/7084; H01L 22/12
USPC ........................... 355/77; 356/399–401, 614
See application file for complete search history.

(56) References Cited

U.S. PATENT DOCUMENTS

| | | |
|---|---|---|
| 2008/0270044 A1 | 10/2008 | Hirai et al. |
| 2009/0147259 A1 | 6/2009 | Peak et al. |
| 2011/0038527 A1 | 2/2011 | Liu |
| 2015/0324965 A1 | 11/2015 | Kulkarni |
| 2016/0377425 A1 | 12/2016 | Gupta et al. |

OTHER PUBLICATIONS

WIPO, ISR for PCT/US2019/033197, dated Sep. 11, 2019.

*Primary Examiner* — Colin W Kreutzer
(74) *Attorney, Agent, or Firm* — Hodgson Russ LLP (57) ABSTRACT

Alignment can be monitored by positioning at least one alignment verification location per alignment frame. The alignment verification location is a coordinate within the alignment frame. A distance between each of the alignment verification locations and a closest instance of an alignment target is determined. An alignment score can be determined based on the distance. The alignment score can include a number of the alignment frames between the alignment verification location and the alignment target. If the alignment score is below a threshold, then alignment setup can be performed.

19 Claims, 5 Drawing Sheets

PERFORMANCE MONITORING OF DESIGN-BASED ALIGNMENT

CROSS-REFERENCE TO RELATED APPLICATIONS

This application claims priority to the provisional patent application filed May 23, 2018 and assigned U.S. App. No. 62/675,641, the disclosure of which is hereby incorporated by reference.

FIELD OF THE DISCLOSURE

This disclosure relates to alignment during semiconductor wafer inspection.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Certain defect identification algorithms used during inspection need an alignment target nearby to find a defect. Alignment targets are typically used to correctly place care areas and perform defect detection with sensitivity that depends on the care area. If the care area is placed slightly differently, then the defect inspection may suffer from lower sensitivity if the defect was in a lower sensitivity care area due to a shift in the care area.

Determining whether a defect identification algorithm can be accurate enough may be challenging. For example, the contrast on an image may be insufficient or design alignment targets may not be usable. Determining accuracy also can be problematic as inspection systems switch between wafers because while the two wafers may have the same design, the features formed on the wafers or the features in the images may be different between the two wafers.

Furthermore, many of nuisance filtering techniques rely on accurate alignment of the patch images to the design. Slight differences in the alignment quality (e.g., due to wafer-to-wafer variation or insufficient density of alignment targets) can cause either excursions or missed defects without any notification that insufficient alignment accuracy is the root cause. However, it can be difficult to determine if design-based alignment is not the root cause of defect density variation within one wafer or from wafer-to-wafer, which may be important for troubleshooting.

Two metrics are currently used. The first metric is a defect-based pattern to design alignment (PDA) quality. The distance between the detected defect and the closest alignment site is calculated. If the distance is small, the alignment score is high. If the distance is large, the alignment score is low. However, if no defects are detected on a certain section of a given wafer, it is unknown whether poor alignment is the reason for not detecting the defects.

The other metric is a swath-based PDA score. If there is a certain number of alignment targets per swath, the swath gets a passing score. Otherwise it gets a failing score. The swath-based PDA score has the disadvantage of not giving granular information. Entire regions within a swath may not be close to any alignment target and still receive a passing score. The opposite is also true. A swath could be reported as failing alignment but certain areas within that swath actually have enough alignment sites and defects can be detected correctly.

Therefore, an improved technique to determine alignment during semiconductor wafer inspection is needed.

BRIEF SUMMARY OF THE DISCLOSURE

A system is provided in a first embodiment. The system includes a light source that directs a light beam at a wafer, a stage configured to hold the wafer, a detector that receives the light beam reflected off the wafer, and a processor in electronic communication with the detector. The processor is configured to position at least one alignment verification location per alignment frame of an image of the wafer. The alignment verification location is a coordinate within the alignment frame. The processor is configured to determine a distance between each of the alignment verification locations and a closest instance of an alignment target. The processor also is configured to determine an alignment score based on the distance. The alignment score includes a number of the alignment frames between the alignment verification location and the alignment target.

The processor can be configured to inspect the wafer and report defects if the alignment score is above a threshold. The processor also can be configured to perform alignment setup if the alignment score is below a threshold.

The alignment score can be determined for a care area in the alignment frame.

The alignment frame may be from 5 μm² to 10 μm².

The processor can be configured to determine a map of alignment scores for the wafer.

A method is provided in a second embodiment. The method comprises positioning, using a processor, at least one alignment verification location per alignment frame on at least one image of a wafer. The alignment verification location is a coordinate within the alignment frame. Using the processor, a distance between each of the alignment verification locations and a closest instance of an alignment target is determined. Using the processor, an alignment score is determined based on the distance. The alignment score includes a number of the alignment frames between the alignment verification location and the alignment target.

The alignment target can be a device or pattern in the alignment frame.

The method can further comprise inspecting the wafer and reporting defects if the alignment score is above a threshold. The method also can further comprise performing alignment setup if the alignment score is below a threshold.

The alignment score can be determined for a care area in the alignment frame.

The alignment frame may be from 5 $\mu m^2$ to 10 $\mu m^2$.

The method can further comprise determining a map of alignment scores for the wafer using the processor.

A non-transitory computer-readable storage medium, comprising one or more programs for executing the following steps on one or more computing devices is provided in a third embodiment. The steps include positioning at least one alignment verification location per alignment frame on at least one image of a wafer. The alignment verification location is a coordinate within the alignment frame. A distance is determined between each of the alignment verification locations and a closest instance of an alignment target. An alignment score is determined based on the distance. The alignment score includes a number of the alignment frames between the alignment verification location and the alignment target.

The programs can inspect the wafer and report defects if the alignment score is above a threshold. The programs also can perform alignment setup if the alignment score is below a threshold.

The alignment score can be determined for a care area in the alignment frame.

The alignment frame may be from 5 $\mu m^2$ to 10 $\mu m^2$.

The programs can determine a map of alignment scores for the wafer using the processor.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The embodiments disclosed herein can monitor the performance of design-based alignment. An alignment score map can be determined for every wafer. The alignment score can be determined even when no defect is detected. An alignment verification location can be used to provide more accurate alignment scores. A care area group dependent alignment score also can be determined.

To have enough relevant sites to measure the distance to a closest alignment target, a grid of alignment verification locations (e.g., artificial defects) can be distributed over the wafer. One possible option is to have at least one alignment verification location per alignment section. For example, one alignment verification location can be positioned every 128×128 $pixels^2$.

The distance between each alignment verification location and the next closest "valid" alignment target can be measured. If the distance is small, then a high alignment score will be reported. If the distance is large, a small alignment score will be reported. This is different from a PDA quality metric because distance between each alignment verification location and the next closest "valid" alignment target is measured at every alignment frame instead of only alignment frames that contain detected defects.

A "valid" alignment target can mean that the alignment target has been compared to the alignment target recorded during setup, which was done on a different area of the same wafer or on a different wafer. If there is within-wafer variation or wafer-to-wafer variation and the alignment target next to the alignment verification location cannot be matched with the setup alignment target, the alignment target will be reported as invalid. In this case, the next closest alignment target will be used and so on. If the closest "valid" alignment target is too far away, a failed score can be affiliated with the artificial defect.

Figure 1:
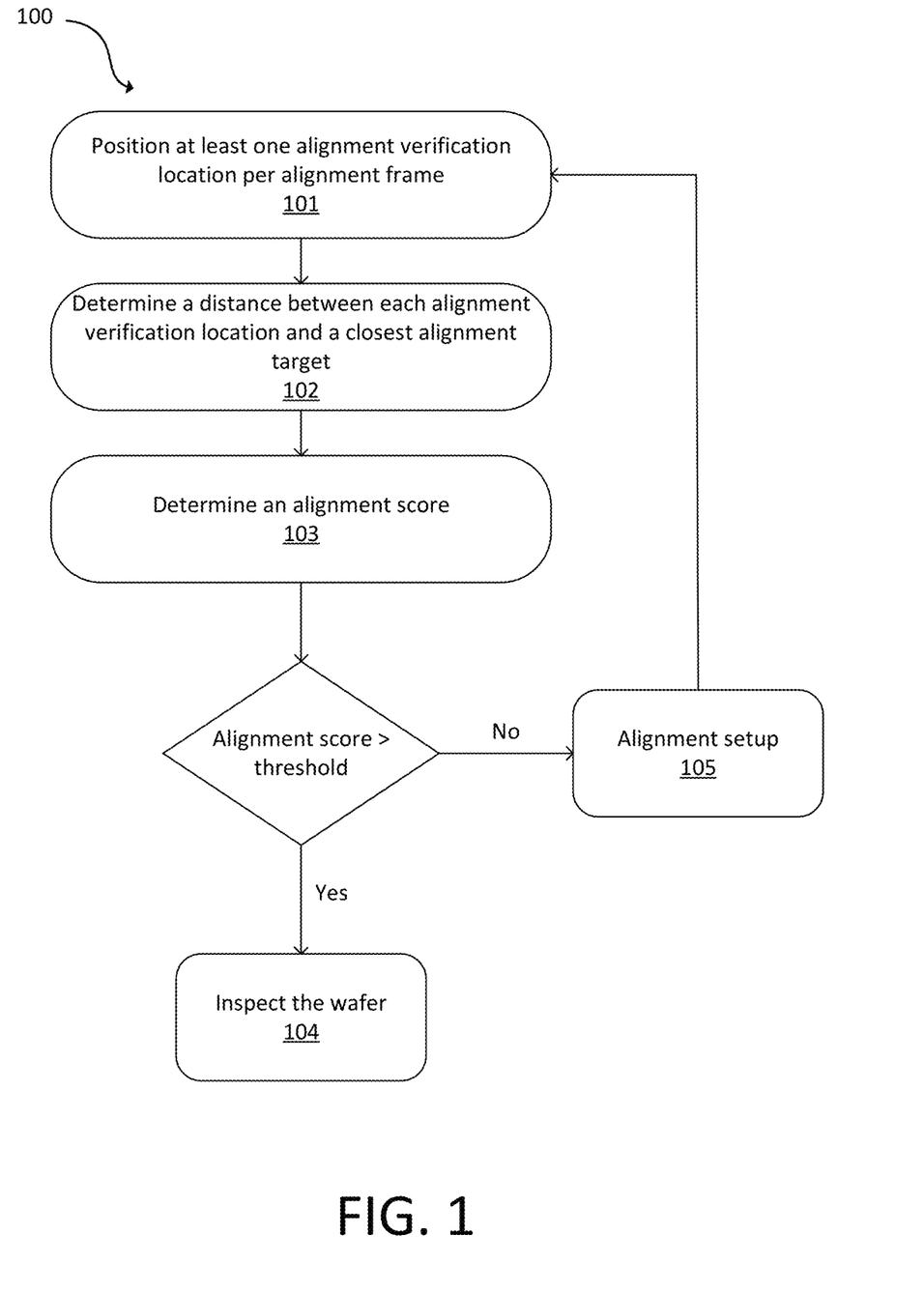
FIG. 1 is a flowchart of an embodiment of a method in accordance with the present disclosure.

FIG. 1 is a flowchart of an embodiment of a method 100. Some or all of the steps of the method 100 can be performed using a processor.

At 101, at least one alignment verification location is positioned per alignment frame. Alignment verification locations may be a random location in each alignment frame. Thus, no defect needs to be detected to validate alignment accuracy. The alignment frame may be from 5 $\mu m^2$ to 10 $\mu m^2$ (e.g., 200 pixels by 200 pixels) or other sizes. In an instance, one alignment verification location is introduced per alignment frame and its alignment score is monitored across all alignment frames for the wafer.

The alignment verification location can be any coordinate within an alignment frame. The alignment verification location can be the same feature in each frame or at a different location or feature in each frame. For example, the alignment verification location may be the center of the frame, another location within the frame, or a feature on a device.

At 102, a distance between each of the alignment verification locations and a closest instance of an alignment target is determined. The distance in, for example, pixels or µm can be determined. Whether the alignment target and alignment verification location are in the same alignment frame also can be determined.

In an instance, this distance is measured by a number of alignment frames between the alignment verification target and an alignment frame with a good alignment target. In another instance, the distance is measured in pixels or nanometers. Measuring in pixels or nanometers may require analysis if there is a good alignment target within the same alignment frame or in another alignment frame.

The alignment target is a device or pattern in the alignment frame. The alignment target may be any feature of the image or device. For example, the alignment target may be an edge of an SRAM, a metrology cell, or a particular logic structure that is a few 100 nm in size and can be resolved relatively well. The alignment target may be a high contrast region with well-defined boundaries. The alignment target may lack repeated features nearby, such as within a 0.5 µm area. The alignment target which is defined on the wafer may need to be in the corresponding design file.

At 103, an alignment score is determined based on the distance. The alignment score may calculate, for example, how many alignment frames are between the alignment verification locations and the alignment target. The results can be in the form of, for example, a distance or an alignment score map. A determination can be made if there is a good alignment target or not, which may be a yes/no decision. All alignment targets which are not good (e.g., low contrast, repeating, etc.) may be dropped.

In an instance, an overall alignment score is determined. The overall alignment score is the percentage of the area on a wafer that can be inspected with high alignment accuracy. In another instance, a wafer or die map with alignment target scores is determined. In yet another instance, a wafer or die map is overlayed with design-based care areas. The alignment score is returned for every care area group independently. Based on the results, certain care areas may not be considered inspectable because they are excluded due to a low alignment score.

The overlay may be performed between the care area map that is design-based and the wafer-based alignment target map (e.g., a map that contains all the alignment frame locations of the wafer and the information if the alignment frame has a good alignment target in it). The alignment score is then specific to a care area and can inform a user what the ratio is between care areas with high alignment score compared to the total number of the specific care areas.

Measurement of alignment quality of all the alignment verification locations can occur in parallel to the regular scan to have a throughput-efficient solution. After the scan is done, all the alignment results can be reported with the regular inspection results.

Even without detecting defects, the alignment quality for every section on the wafer can be monitored. For example, an evaluation can be performed to determine if the alignment score is larger than a threshold. The threshold may be set based on the type of semiconductor device. For example, logic, memory, small care areas, or other features may affect the threshold.

If high process variation does not allow accurate alignment, a low alignment score will be returned telling the user that defects might be missed due to the low score and wafer processing decisions may not be possible due to the low alignment score.

If the alignment score is larger than a threshold, the wafer is inspected and defects are reported at 104.

If the alignment score is not larger than a threshold, then alignment setup is performed at 105. Then the method 100 can optionally be repeated. During alignment setup, the available alignment targets can be evaluated and a new alignment target can be selected. The alignment frames may remain the same during the alignment setup. In an example, an alignment target from one wafer may not work on a second wafer because the alignment target is too blurry in the second wafer. A new corner or other feature on the second wafer is used as an alignment target instead.

The alignment score can be determined for a care area in the alignment frame. Logic and memory sections of a semiconductor device may have different accuracy requirements, so care areas may be used for these different sections. If certain care areas are placed at a location on the wafer that does not have sufficient alignment targets, the user may be informed that inspecting these care areas is not possible using the current recipe setup. In an instance, both an overall alignment score and an alignment score for a care area in the alignment frame can be determined.

Figure 2:
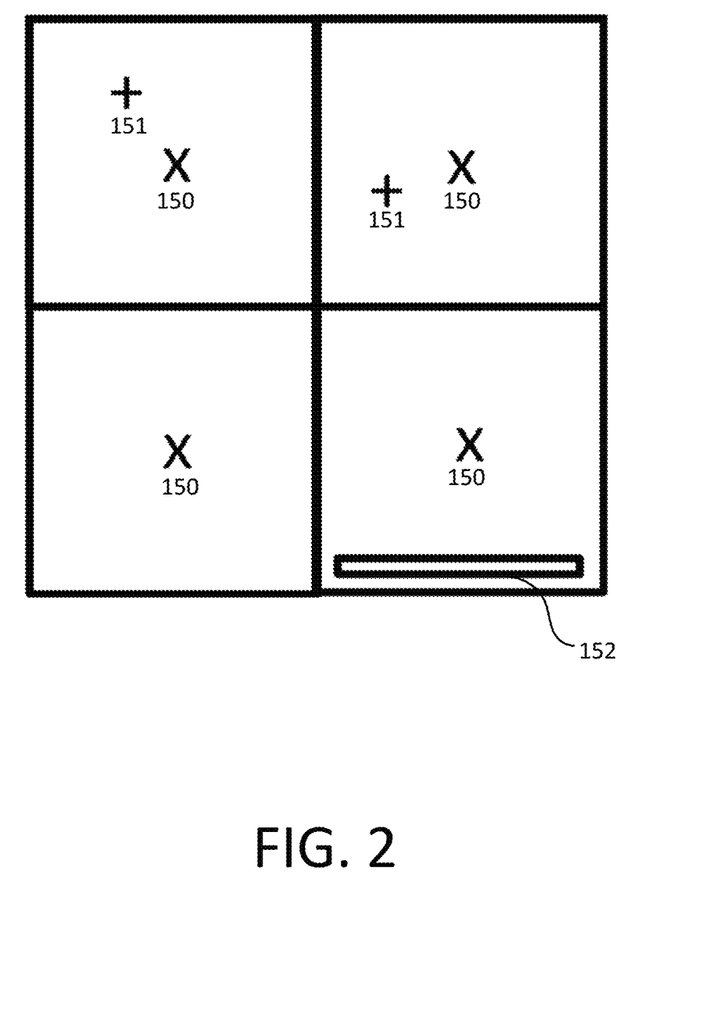
FIG. 2 is diagram of an exemplary alignment verification check.

FIG. 2 is diagram of an exemplary alignment verification check. The example of FIG. 2 has four alignment frames, but more or fewer alignment frames are possible. The X in the center of each alignment frame is an alignment verification location 150. Alignment targets 151 are shown in two of the alignment frames.

Lower quadrants do not have any alignment targets 151. Consequently, the defects within the care area 152 may not be detected because the care area 152 is small and requires too high of an alignment accuracy to be inspected. Small care areas may refer to single pixel care areas, which may means 30 by 30 $nm^2$. This is one reason why a sub-pixel location accuracy may be needed. Without sub-pixel location accuracy, the care area can be easily placed on the pixel next to the target pixel. In this case, it is better to not have the care area at all because the defect would not come from the area of interest. The care areas could be expanded if the alignment target is too far away, but this may result in more nuisance events because those small care areas may be small and may have overwhelming noise patterns in their vicinity.

With the new alignment verification step, the user will be informed about this potential problem and can perform corrective actions (e.g., do an alignment retrain, change the search conditions for alignment targets during setup, etc.). When performing an alignment retrain, the rendering parameters that match the rendered design image with the optical image can be performed again. Those rendering parameters may be adjusted to the wafer that is currently inspected. Thus, the rendering parameters are adjusted to this specific wafer. In addition, more alignment targets can be searched because storage capacity may limit the number of alignment targets that were identified during setup to the best ones. Those stored alignment targets may be best on the setup wafer, but not on the inspection wafer.

Figure 3:
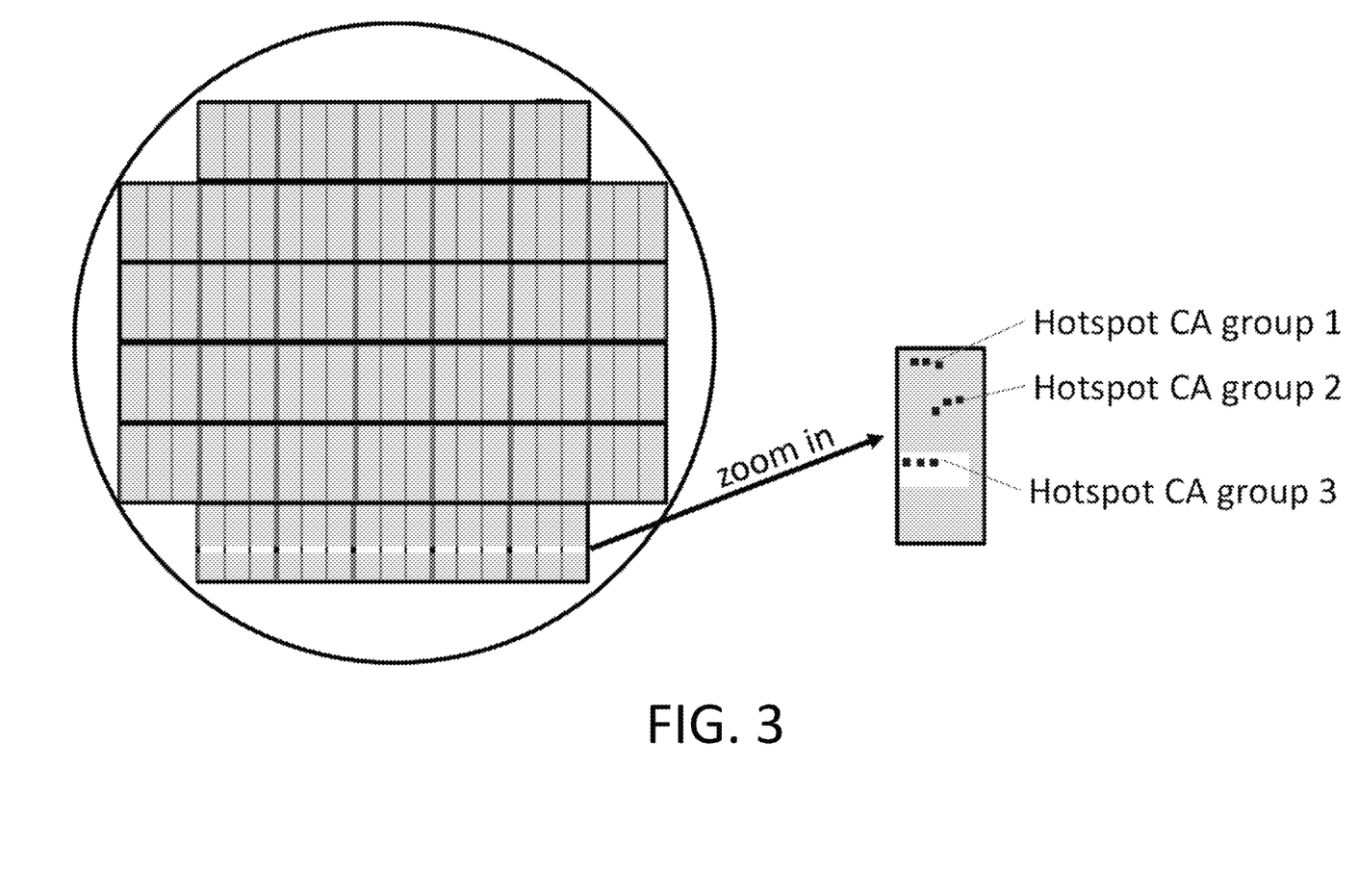
FIG. 3 is an exemplary output using the embodiments disclosed herein.

FIG. 3 is an exemplary output using the embodiments disclosed herein. In the exemplary wafer map, areas with a high alignment score are shown in grey and a low alignment score are shown in white due to within-wafer variation. As seen in the exemplary wafer map, the hotspot care area (CA) group 3 on the lower edge of the wafer may not be inspectable.

Figure 4:
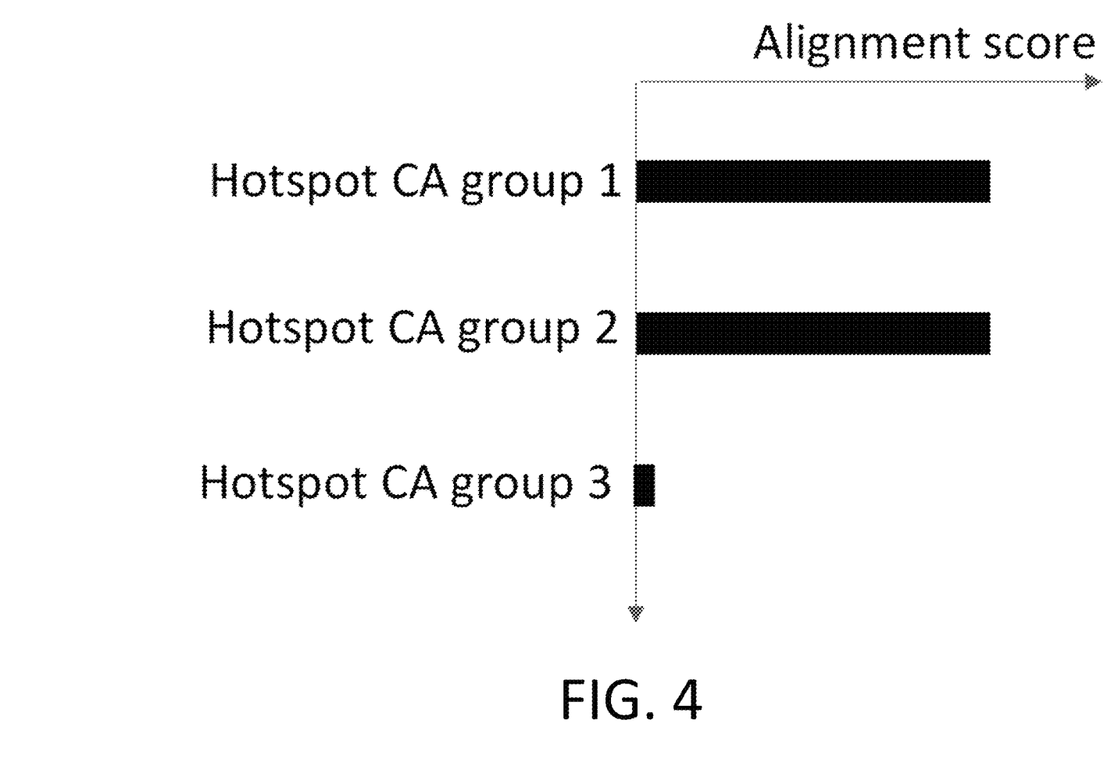
FIG. 4 is an exemplary chart showing alignment scores for various groups.

FIG. 4 is an exemplary chart showing alignment scores for various groups. Care area based alignment score showing that hotspot care area group 3 from FIG. 3 is located in an area which does not have a sufficient number of alignment targets. If this care area is critical for monitoring the yield and depends on good alignment, the recipe setup may need to be revisited for improvement or modification.

In another embodiment, the method includes checking if there is an alignment target in the alignment frame for every alignment frame and if the target is still "valid" (i.e., within the wafer or when wafer-to-wafer variation does not make the alignment target unusable) for every alignment frame. This may not determine a distance between each of the alignment verification locations and a closest instance of an alignment target or determine an alignment score based on the distance.

Figure 5:
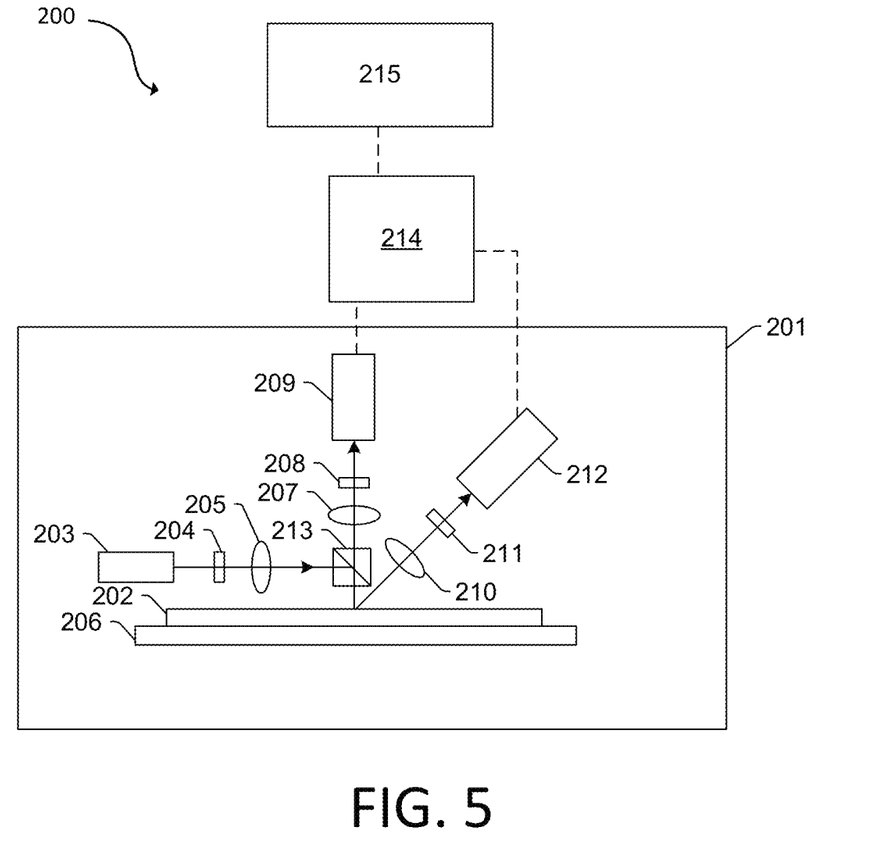
FIG. 5 is a diagram of a system embodiment in accordance with the present disclosure.

One embodiment of a system 200 is shown in FIG. 5. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen includes a reticle. The reticle may include any reticle known in the art.

In the embodiment of the system 200 shown in FIG. 5, optical based subsystem 201 includes an illumination subsystem configured to direct light to specimen 202. The illumination subsystem includes at least one light source. For example, as shown in FIG. 5, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 5, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 5. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 5 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 5) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broadband plasma (BBP) source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 5 as a single refractive optical element, it is to be understood that, in practice, lens 205 may include a number of refractive and/or reflective optical elements that in combination focus the light from the optical element to the specimen. The illumination subsystem shown in FIG. 5 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 5 includes two detection channels, one formed by collector 207, element 208, and detector 209 and another formed by collector 210, element 211, and detector 212. As shown in FIG. 5, the two detection channels are configured to collect and detect light at different angles of collection. In some instances, both detection channels are configured to detect scattered light, and the detection channels are configured to detect tight that is scattered at different angles from the specimen 202. However, one or more of the detection channels may be configured to detect another type of light from the specimen 202 (e.g., reflected light).

As further shown in FIG. 5, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 5 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 5 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 5 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 5 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with a scanning electron microscope (SEM).

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be further configured as described herein.

The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 is configured to position at least one alignment verification location per alignment frame of an image of a wafer. The alignment verification location is a coordinate within the alignment frame. The processor 214 is configured to determine a distance between each of the alignment verification locations and a closest instance of an alignment target. The processor 214 also is configured to determine an alignment score based on the distance. The alignment score includes a number of the alignment frames between the alignment verification location and the alignment target.

An additional embodiment relates to a non-transitory computer-readable medium storing program instructions executable on a controller for performing a computer-implemented method for monitoring alignment, as disclosed herein. In particular, as shown in FIG. 5, electronic data storage unit 215 or other storage medium may contain non-transitory computer-readable medium that includes program instructions executable on the processor 214. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
a light source that directs a light beam at a wafer;
a stage configured to hold the wafer;
a detector that receives the light beam reflected off the wafer; and
a processor in electronic communication with the detector, wherein the processor is configured to:
position at least one alignment verification location per alignment frame of an image of the wafer, wherein the alignment verification location is a coordinate within the alignment frame;
determine a distance between each of the alignment verification locations and a closest instance of an alignment target; and
determine an alignment score based on the distance, wherein the alignment score includes a number of the alignment frames between the alignment verification location and the alignment target.

2. The system of claim 1, wherein the processor is configured to inspect the wafer and report defects if the alignment score is above a threshold.

3. The system of claim 1, wherein the processor is configured to perform alignment setup if the alignment score is below a threshold.

4. The system of claim 1, wherein the alignment score is determined for a care area in the alignment frame.

5. The system of claim 1, wherein the alignment frame is from 5 µm$^2$ to 10 µm$^2$.

6. The system of claim 1, wherein the processor is configured to determine a map of alignment scores for the wafer.

7. A method comprising:
positioning, using a processor, at least one alignment verification location per alignment frame on at least one image of a wafer, wherein the alignment verification location is a coordinate within the alignment frame;
determining, using the processor, a distance between each of the alignment verification locations and a closest instance of an alignment target; and determining, using the processor, an alignment score based on the distance, wherein the alignment score includes a number of the alignment frames between the alignment verification location and the alignment target.

8. The method of claim 7, wherein the alignment target is a device or pattern in the alignment frame.

9. The method of claim 7, further comprising inspecting the wafer and reporting defects if the alignment score is above a threshold.

10. The method of claim 7, further comprising performing alignment setup if the alignment score is below a threshold.

11. The method of claim 7, wherein the alignment score is determined for a care area in the alignment frame.

12. The method of claim 7, wherein the alignment frame is from 5 $\mu m^2$ to 10 $\mu m^2$.

13. The method of claim 7, further comprising determining a map of alignment scores for the wafer using the processor.

14. A non-transitory computer-readable storage medium, comprising one or more programs for executing the following steps on one or more computing devices:

positioning at least one alignment verification location per alignment frame on at least one image of a wafer, wherein the alignment verification location is a coordinate within the alignment frame;

determining a distance between each of the alignment verification locations and a closest instance of an alignment target; and determining an alignment score based on the distance, wherein the alignment score includes a number of the alignment frames between the alignment verification location and the alignment target.

15. The non-transitory computer-readable storage medium of claim 14, wherein the programs further inspect the wafer and report defects if the alignment score is above a threshold.

16. The non-transitory computer-readable storage medium of claim 14, wherein the programs further perform alignment setup if the alignment score is below a threshold.

17. The non-transitory computer-readable storage medium of claim 14, wherein the alignment score is determined for a care area in the alignment frame.

18. The non-transitory computer-readable storage medium of claim 14, wherein the alignment frame is from 5 $\mu m^2$ to 10 $\mu m^2$.

19. The non-transitory computer-readable storage medium of claim 14, wherein the programs further determine a map of alignment scores for the wafer using the processor.

* * * * *